United States Patent
Kanskar et al.

(10) Patent No.: US 7,586,970 B2
(45) Date of Patent: Sep. 8, 2009

(54) HIGH EFFICIENCY PARTIAL DISTRIBUTED FEEDBACK (P-DFB) LASER

(75) Inventors: Manoj Kanskar, Madison, WI (US); Yiping He, Madison, WI (US); Steven H. Macomber, Tucson, AZ (US)

(73) Assignee: Alfalight, Inc., Madison, WI (US)

( * ) Notice: Subject to any disclaimer, the term of this patent is extended or adjusted under 35 U.S.C. 154(b) by 0 days.

(21) Appl. No.: 11/777,913

(22) Filed: Jul. 13, 2007

(65) Prior Publication Data

US 2008/0205476 A1 Aug. 28, 2008

Related U.S. Application Data

(60) Provisional application No. 60/891,396, filed on Feb. 23, 2007.

(51) Int. Cl.
*H01S 3/08* (2006.01)
(52) U.S. Cl. .................... 372/96; 372/92; 372/102
(58) Field of Classification Search ............ 372/43.01, 372/49.01, 92, 96, 102
See application file for complete search history.

(56) References Cited

U.S. PATENT DOCUMENTS

| | | | |
|---|---|---|---|
| 4,363,116 A | | 12/1982 | Kleuters et al. |
| 4,365,323 A | | 12/1982 | Heemskerk et al. |
| 5,568,505 A | * | 10/1996 | Okuda et al. ............... 372/96 |
| 5,802,096 A | * | 9/1998 | Okuda .................... 372/102 |
| 5,854,780 A | | 12/1998 | Opheij et al. |
| 6,108,481 A | * | 8/2000 | Tohyama et al. .......... 385/131 |
| 6,175,581 B1 | * | 1/2001 | Sato ........................ 372/50.11 |
| 6,195,381 B1 | | 2/2001 | Botez et al. |
| 6,455,876 B1 | * | 9/2002 | Kikawa et al. ............... 257/98 |
| 6,674,783 B1 | * | 1/2004 | Funabashi et al. ............ 372/96 |
| 6,696,311 B2 | | 2/2004 | Macomber et al. |
| 6,822,982 B2 | * | 11/2004 | Yoshida et al. ............... 372/20 |
| 6,839,377 B2 | * | 1/2005 | Bacher .................... 372/102 |
| 6,885,793 B2 | | 4/2005 | Macomber |
| 6,947,463 B2 | * | 9/2005 | Tsukiji et al. ............ 372/50.11 |
| 2002/0154665 A1 | * | 10/2002 | Funabashi et al. ............ 372/45 |
| 2003/0008530 A1 | | 1/2003 | Tsukiji et al. |
| 2003/0063645 A1 | * | 4/2003 | Yoshida et al. ............... 372/49 |

(Continued)

FOREIGN PATENT DOCUMENTS

EP          1 696 527 A2        8/2006

(Continued)

OTHER PUBLICATIONS

R. Hofmann et al., "Realization of optically pumped second-order GaInN-distributed-feedback lasers", Sep. 30, 1996, *Appln. Phys. Lett.*, vol. 69, No. 14, pp. 2068-2070.

(Continued)

*Primary Examiner*—Minsun Harvey
*Assistant Examiner*—Phillip Nguyen
(74) *Attorney, Agent, or Firm*—Colin L. Fairman; Fulbright & Jaworski LLP

(57) ABSTRACT

A second-order multi-mode partial distributed feedback (p-DFB) laser having increased electrical-to-optical power conversion efficiency, stabilized wavelength and narrowed emission linewidth. The laser includes an abbreviated grating housed in the laser cavity that is separated from both the front-end and the back-end of the laser facets.

4 Claims, 5 Drawing Sheets

U.S. PATENT DOCUMENTS

| | | | |
|---|---|---|---|
| 2003/0081646 A1* | 5/2003 | Bacher | 372/102 |
| 2003/0133482 A1* | 7/2003 | Yoshida et al. | 372/43 |
| 2005/0122571 A1 | 6/2005 | Kim et al. | |
| 2005/0276302 A1* | 12/2005 | Okunuki | 372/98 |

FOREIGN PATENT DOCUMENTS

| | | |
|---|---|---|
| WO | WO 95/31021 | 11/1995 |

OTHER PUBLICATIONS

Ali M. Shams-Zadeh-Amiri et al, "Second- and Higher Order Resonant Gratings with Gain or Loss—Part II: Designing Complex-Coupled DFB Lasers with Second-Order Gratings", *IEEE Journal of Quantum Electronics*, vol. 36, No. 12, Dec. 2000, pp. 1431-1437.

M. Kanskar, et al. "73% CW power conversion efficiency at 50 W from 970 nm diode laser bars", Electron. Lett. vol. 41, p. 33, 2005.

J. S. Major, et al., "Singlemode InGaAs/GaAs distributed Bragg reflector laser diodes operating at 1083 nm", Electron. Lett. vol. 29, No. 24, p. 2121, 1993.

Y. Twu, et al., "GaInAsP Distributed Feedback Laser Array", Electron. Lett. vol. 24, No. 12, p. 1144, 1988.

K. Y. Liou, et al., "High-Power Multiple-Quantum-Well Distributed Feedback Laswer Arrays and Fabry-Perot Laswer Arrays at 1.5 µm Wavelength", Tech. Dig. 13th IEEE Int. Semicond. Laser Conf., Paper D7, 1992.

M. Kanskar et al., "High Power Conversion Efficiency and Wavelength Stabilized, Narrow Bandwidth 975nm Diode Laser Pumps", pp. 1-4, Apr. 17-18, 2006.

M. Kanskar et al., "53% Wall-plug Efficiency 975 nm Distributed Feedback Broad Area Laser", vol. 42, Issue 25, Dec. 7, 2006, pp. 1455-1457.

\* cited by examiner

Intensity  Phase

HIGH EFFICIENCY PARTIAL DISTRIBUTED FEEDBACK (P-DFB) LASER

CROSS-REFERENCE TO RELATED APPLICATIONS

This application seeks priority from U.S. provisional application 60/891,396 filed on Feb. 23, 2007, which is incorporated herein by reference in its entirety, for all purposes.

FIELD OF THE INVENTION

This invention pertains generally to the field of semiconductor diode lasers and particularly to edge emitting distributed feedback semiconductor lasers.

BACKGROUND OF THE INVENTION

Semiconductor diode lasers are formed of multiple layers of semiconductor materials. The typical semiconductor diode laser includes an n-type layer, a p-type layer and an undoped active layer between them such that when the diode is forward-biased, electrons and holes recombine in the active region layer with the resulting emission of light. The active layers (quantum well(s) resides in the waveguide layer, which has a higher index of refraction than the cladding layers that confine the emitted light to the waveguide and the active layers . Semiconductor lasers may be constructed to be either edge emitting or surface emitting. In an edge emitting Fabry-Perot (FP) type semiconductor laser, crystal facet mirrors are located at opposite edges of the multi-layer structure to provide reflection of the emitted light back and forth in a longitudinal direction, generally in the plane of the layers, to provide generation of laser light (lasing) action and emission of laser light from one of the facets. Another type of device, which may be designed to be either edge emitting or surface emitting, utilizes distributed feedback (DFB) structures rather than conventional facets or mirrors, providing feedback for lasing as a result of backward Bragg scattering from periodic variations of the refractive index or the gain or both of the semiconductor laser structure ensuing in narrowed emission bandwidth for the output spectrum and lower sensitivity to wavelength drift due to temperature variation.

High power diode lasers have been extensively used for pumping high power solid-state lasers such as the thin disk, slab, rod, micro-chip and fiber lasers that are useful for industrial, printing, medical applications and scientific instrumentation. There are also emerging alkali-vapor gas lasers that are pumped by semiconductor lasers. Multimode 975 nm diode lasers are of particular interest for pumping the upper transition states of rare-earth doped (such as Yb, Er and Yb/Er co-doped) solid state lasers, fiber lasers and amplifiers. At this pump wavelength, the quantum defect is minimal and the absorption cross-section is much higher (2.5 dB/m) relative to the 920 nm transition states (0.7 dB/m). Hence, shorter gain fibers may be used to mitigate deleterious nonlinear effects such as the Stimulated Raman Scattering (SRS) and the Stimulated Brillouin Scattering (SBS) that can occur in high average or peak power application. However, the absorption bandwidth at 975 nm is quite narrow (<9 nm FWHM). Similarly, the absorption peak is narrow for other solid-state host materials with Yb, Er or Yb/Er co-doping. Nd-doped solid-state gain media such as Nd:YAG also has narrow absorption cross-section near 808 nm and 885 nm absorption bands. As a result, either expensive thermal stabilization measures or very sensitive external wavelength-locking methods such as use of diffraction gratings, Fiber Bragg Gratings (FBG) or Volume Bragg Gratings (VBG) in an external cavity configuration have to be employed making diode lasers less attractive as pump sources for these applications to pump at the narrow gain band region. A monolithic integration of Bragg grating inside the semiconductor laser cavity is a simpler and a more cost-effective means of achieving both the wavelength stabilization as well as emission linewidth narrowing making multimode DFB laser an attractive pump source for the aforementioned precision-pumping applications.

Semiconductor lasers having continuous wave (CW) power in the several watt-range and narrow bandwidth, e.g., less than 3 Å. full width half maximum (FWHM), would be desirable for a variety of applications. Conventional, FP broad stripe ($\geq 25$ µm) semiconductor lasers used for obtaining high powers typically have a spectral width of about 20 Å FWHM or more at high drive levels and broaden further under quasi-CW operation. Since the lasing wavelength in FP diode laser is determined by the peak wavelength of the gain spectrum, the center of the lasing wavelength shifts as a function of temperature. This temperature tuning rate is approximately 0.32 nm per Centigrade. Significant improvements in spectral width and temperature tuning rate can be obtained using distributed feedback (DFB) gratings as reported by M. Kanskar, et al, Electron. Lett. Vol. 41, p. 33, 2005, or distributed Bragg reflectors (DBR) rather than FP mirror facets for optical feedback. A CW power of about 278 mW with about 1 Å of wavelength variation, resulting from mode hopping, has been reported for narrow-stripe DBR lasers. J. S. Major, et al., Electron. Lett. Vol. 29, No. 24, p. 2121, 1993. Using DFB phase-locked laser arrays, narrow bandwidth operation has been obtained from large apertures at relatively long wavelengths ($\lambda=1.3$ µm to 1.5 µm). Pulsed operation at a power level of 120 mW has been reported from a 45 µm aperture device ($\lambda=1.3$ µm), Y. Twu, et al., Electron. Lett. Vol. 24, No. 12, p. 1144, 1988, and 85 mW CW from a 72 µm aperture device ($\lambda=1.55$ µm), K. Y. Liou, et al., Tech. Dig. 13th IEEE Int. Semicond. Laser Conf., Paper D7, 1992. For applications where (lateral) spatial coherence is not necessary, a broad-stripe laser with a DFB grating is apparently well suited for achieving high CW powers with narrow spectral linewidth and more robust temperature tuning characteristics.

For diode lasers operating in the near infrared spectral region, it is simple and cost-effective to fabricate a second-order grating since the grating pitch is typically submicron in length. However, when a second-order distributed feedback laser is fabricated there is an additional optical power loss incurred compared to a FP or the first-order DFB laser. This problem arises because the second-order grating has a first-order diffraction that scatters light out in directions that are normal to the propagation direction of the fundamental mode. As a result, the differential quantum efficiency (DQE) is usually lower than that for the FP or the first-order DFB laser making the power-conversion efficiency of a second-order DFB laser poorer.

It is known that magnitude of the first-order diffraction loss in DFB lasers can also be minimized by reducing the index contrast of the grating and/or by placing the grating far away from the peak of the transverse optical intensity, as discussed in U.S. Pat. No. 6,455,341 by Macomber. As disclosed by Macomber, the first-order diffraction loss is minimized by introducing low index contrast which leads to lower scattering strength for the grating thereby reducing scattering loss. Additionally, by locating the grating where the transverse optical intensity is lower, the fraction of the diffracted light is reduced. This technique pertains to minimization of the transverse optical field only and does not address the issue of continual diffraction loss which occurs during propagation along the longitudinal direction as the laser light oscillates back and forth numerous times inside the DFB laser cavity.

Currently, the most straightforward method to overcome diffraction loss from the laser cavity is to introduce a first-order grating in the laser cavity. As a result, there are no possible diffraction orders that could lead to radiation loss from the cavity modes. However, making a first-order grating can be impractical and expensive, especially for short wavelength radiation. In order to overcome this practical problem, a second-order grating that is distributed over the entire gain volume (e.g. laser cavity) is used to both stabilize and narrow the emission bandwidth of a laser. While this method stabilizes the wavelength and narrows the emission bandwidth, the second-order grating distributed across the entire laser cavity leads to continuous first-order diffraction loss of radiation out of the cavity as the laser modes oscillate back and forth inside the resonator. Monolithic distributed Bragg reflector (DBR) lasers have also been used in the past to stabilize and lock the wavelength, such as, for example, TOPTICA PHOTONICS (Westfield, Mass.). This technique has an additional disadvantage. The DBR section is not electrically pumped; hence, the gain section underneath the DBR acts as a saturable absorber, reducing the overall efficiency of the laser. Additionally, the use of a saturable absorber can also lead to a deleterious effect known as self-pulsation.

FIG. 1 illustrates some concepts of a conventional distributed feedback laser 40. As shown and used herein, the term laser "cavity" 12 refers to the space between the high reflection coating (HR) 14 and the anti-reflection coating (AR) 16 of the laser. As used herein, the term "laser facet" refers to the facet holding the HR and AR coating. Thus, the back, or rear facet 18 is defined by the HR coating and the front facet 20 is defined by the AR coating. A grating 42 is a dielectric layer with a periodic perturbation of the refractive index so that sufficient reflectivity may be reached at a wavelength due to Bragg scattering which provides optical feedback for the lasing to be established. Gratings are constructed to reflect only a narrow band of wavelengths and thus, produce a narrow linewidth of laser output.

It would be desirable however, to further reduce first-order scattering loss in a distributed feedback laser that uses a second-order grating so that a maximum possible efficiency could be achieved.

SUMMARY OF THE INVENTION

This invention pertains to a scheme that provides a high power-conversion efficiency pump laser solution that uses a partial distributed feedback (p-DFB) mechanism using a monolithic Bragg grating that is judiciously chosen to reside inside a semiconductor laser cavity at a location that provides maximum efficiency.

A second-order multi-mode partial distributed feedback (p-DFB) laser having increased electrical-to-optical power conversion efficiency, stabilized wavelength and narrowed emission linewidth is disclosed. The laser includes an abbreviated grating housed in the laser cavity that is separated from both the front-end and the back-end of the laser facets. By situating the grating in the back-end of the laser cavity, both lower loss and stronger mode discrimination is achieved. Thus, the first-order diffraction loss was significantly reduced, leading to a higher output power and therefore a higher electrical-to-optical power conversion efficiency in the laser. In addition, the abbreviated grating allows for greater ability of the light waves to be in sympathy with the peaks and valleys of the grating; therefore, the DFB laser should not be very sensitive to the random facet-grating phase problem which leads to variable spectral output.

Therefore, in one exemplary embodiment, the invention comprises an edge emitting semiconductor laser including a second order diffraction grating occupying only part of the laser cavity. In this embodiment, the partial grating is situated inside the laser cavity such that it is separated from both the front and back facets. In some preferred embodiments, the partial grating is placed near the back facet of the laser cavity where the total optical field is lower.

In yet another preferred embodiment, the invention provides an edge emitting semiconductor laser having a second order diffraction grating where, as shown in FIG. 4B, a partial grating is separated from the front facet and the back facet by a distance x approximately defined by range:

$$\frac{\lambda^2}{8n_g\Delta\lambda} < x < \frac{L}{5}$$

where $\Delta\lambda$ is a maximum allowed wavelength variation caused by interfering facet reflections, $n_g \approx 4$ is the group index, $\lambda$ is the vacuum wavelength and L is the length of the grating. In some versions of the invention, the length $L_{DFB}$ of the partial grating is defined by:

$$\frac{\lambda^2}{2n_g\Delta\lambda} < L_{DFB} < \frac{L}{5}.$$

In yet another embodiment, the invention includes an edge emitting semiconductor laser having a lower diffraction loss comprising a second order diffraction grating where the second order diffraction grating comprises a partial grating separated from the front facet or the back facet and placement of the partial grating within a laser cavity at about the region of lowest optical field. In some exemplary embodiments the region of lowest optical field within the laser cavity is proximate to the back facet of the cavity.

In still other embodiments, the invention comprises a composite laser having more than one semiconductor laser wherein at least one semiconductor laser has a partial grating and wherein the partial grating results in increased efficiency of the composite laser.

In yet another exemplary embodiment the invention includes a method for the fabrication of a high efficiency and multimode partially distributed feedback semiconductor laser comprising, abbreviating the length of the grating, and situating the grating in the laser cavity proximate to the back facet. In some preferred embodiments, the grating is placed in the laser cavity at the area of lowest optical field.

In yet another exemplary embodiment, the invention comprises a method of lasing using a high efficiency partial distributed feedback laser wherein the laser is made by: fabricating a semiconductor laser structure having a partial grating situated in a laser cavity; passing energy into the laser cavity; and emitting a beam of coherent photons. Using this version, high efficiency lasing is achieved. In some preferred embodiments of the invention, the grating is situated in the laser cavity at about the region of lowest optical field.

Other objects, features and advantages of the present invention will become apparent after review of the specification, claims and drawings.

DETAILED DESCRIPTION OF THE EXEMPLARY EMBODIMENTS

I. In General

Figure 1:
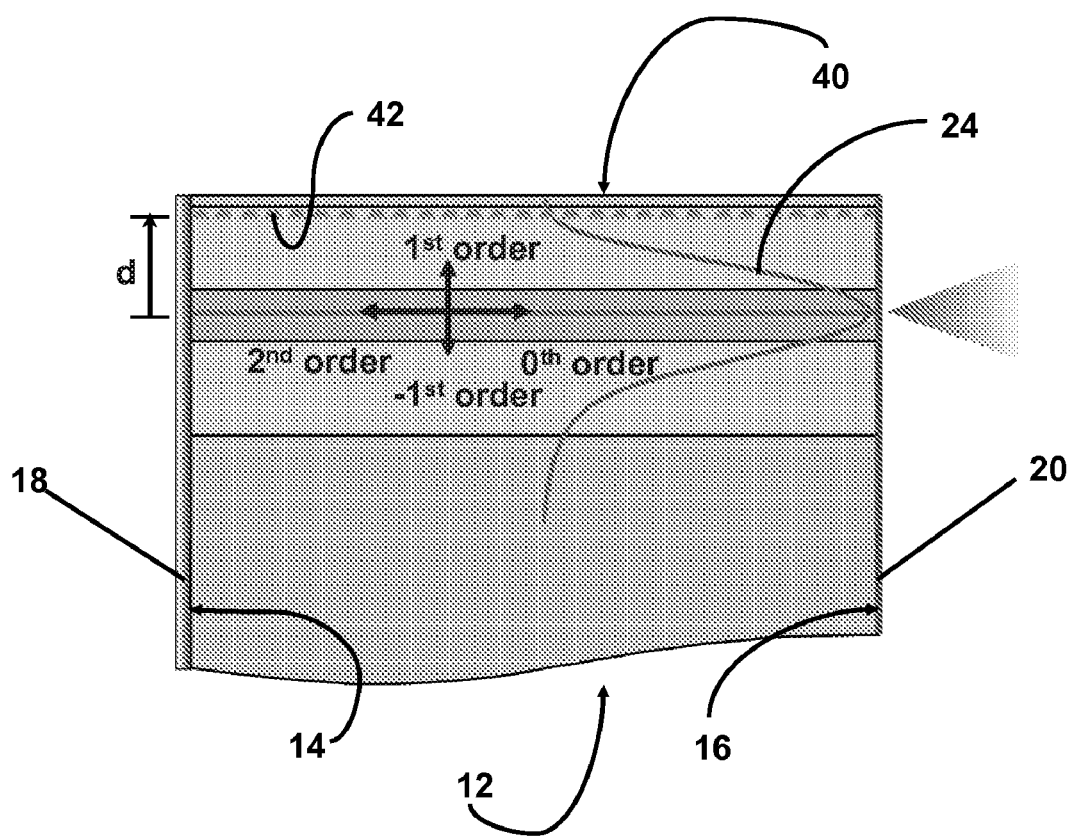
FIG. 1 is a schematic drawing of a conventional semiconductor laser with second-order distributed feedback (DFB) grating, located at a distance, 'd' from the peak of the optical intensity. The arrows indicate the directions of the fundamental mode propagation, second-order feedback propagation and the first-order diffraction losses.

It must be noted that as used herein and in the appended claims, the singular forms "a", "an", and "the" include plural reference unless the context clearly dictates otherwise. As well, the terms "a" (or "an"), "one or more" and "at least one" can be used interchangeably herein. It is also to be noted that the terms "comprising", "including", "characterized by" and "having" can be used interchangeably.

Unless defined otherwise, all technical and scientific terms used herein have the same meanings as commonly understood by one of ordinary skill in the art to which this invention belongs. All publications and patents specifically mentioned herein are incorporated by reference for all purposes including describing and disclosing the chemicals, instruments, statistical analyses and methodologies which are reported in the publications which might be used in connection with the invention. All references cited in this specification are to be taken as indicative of the level of skill in the art. Nothing herein is to be construed as an admission that the invention is not entitled to antedate such disclosure by virtue of prior invention.

As used herein, the terms 'partial' and 'abbreviated' are used interchangeably and mean shortened; reduced in length; abridged. For example, an abbreviated or partial grating means a grating that is shortened to a length such that placement in the laser cavity does not fill up the entire cavity but rather results in the ability to place the grating more toward the front or the back of the cavity. The term "proximate" means near to, or nearer to one area than an opposing area. Thus, the term "proximate to the back" means closer to the back than the front. As used herein the term "cleave" refers to the process of breaking the layered semiconductor materials along the facets prior to application of the HR and AR layers. As used herein the term "stripe" or "stripe length" refers to the width of the metal contact onto semiconductor laser that is used to inject current.

The invention and the various features and advantageous details thereof are explained more fully with reference to the non-limiting embodiments that are illustrated in the accompanying drawings and detailed in the following description. Descriptions of well known components and processing techniques are omitted so as not to unnecessarily obscure the invention in detail but such descriptions are, nonetheless, included in this disclosure by incorporation by reference of all the citations included herein. It should be understood, however, that the detailed description and the specific examples, while indicating preferred embodiments of the invention, are given by way of illustration only and not by way of limitation. Various substitutions, modifications, additions and/or rearrangements within the spirit and/or scope of the underlying inventive concept will become apparent to those skilled in the art from this detailed description.

II. The Invention

The invention provides a second-order multi-mode partial distributed feedback (p-DFB) laser having increased efficiency, wavelength locking capability and narrowed linewidth. Typically, FP semiconductor lasers have the characteristic whereby center wavelength shifts at a rate of approximately 0.32 nm per degree centigrade. Furthermore, the emission bandwidth is approximately 2 nm to 3 nm wide at the full-width-half-maximum point. DFB and p-DFB lasers have a much better wavelength locking capability due to second-order grating feedback which locks the wavelength at the Bragg wavelength established by the pitch of the grating and the effective index of the optical modes. Hence, the center wavelength shifts at approximately 0.07 nm per degree Centigrade only. Filtering capability of the grating also narrows the emission bandwidth down to approximately 0.3 nm or less only. The laser includes an abbreviated grating housed in the laser cavity that is separated from both the front-end and the back-end. By situating the grating at, about, the back-end of the laser cavity, where the optical intensity was less, the first-order diffraction loss emanating from the laser is significantly reduced. In addition, the abbreviated grating allows for greater ability of optical field to be in sympathy with the peaks and valleys of the grating.

In yet another exemplary embodiment, the invention comprises an edge emitting semiconductor laser comprising, a second order diffraction a partial grating separated from the front facet and the back facet; and placement of the partial grating within the laser cavity at the region of lowest electric field. In this exemplary embodiment, the optical field and the grating pitch are synchronized and the location of the grating leads to less optical field entering the grating. Thus, the surface-normal scattering is less and the energy efficiency of the laser is increased.

In still other embodiments, the invention comprises a composite laser having more than one semiconductor laser wherein at least one semiconductor laser has a partial grating and wherein the partial grating results in increased efficiency of the composite laser.

In yet another exemplary embodiment, the invention includes a method for the fabrication of a high efficiency and multimodal a partially distributed feedback semiconductor laser comprising, abbreviating the size of the grating, placing the grating at about the back facet of the laser cavity. Using this method, the diffraction leaving the grating is decreased and the efficiency is increased.

In still another exemplary embodiment, the invention comprises a method of using a high efficiency partial distributed feedback laser wherein the laser is constructed by using an abbreviated grating, placing the grating at the back facet of the laser cavity and pumping the electrical energy to produce laser light resulting in less diffraction of light wave and higher efficiency of the laser.

Because when a second-order pDFB laser is fabricated the second order grating has a first-order diffraction loss, light is scattered out in directions that are normal to the propagation direction of the fundamental mode, this is shown schematically in FIG. 1. This results in an optical power loss when compared to a FP or the first-order DFB laser. Therefore, the differential quantum efficiency (dqe) is usually lower than FP or the first-order DFB laser making the power-conversion efficiency of a second-order DFB laser poorer. Further, imperfections in the grating introduced during the fabrication process lead to additional scattering loss determined by the spatial frequencies resulting from the size of the imperfections formed during grating fabrication process. The diffused scattering loss occurs not only with the second-order grating but to any order grating.

As indicated above, a second-order DFB laser constructed according to the invention does not exhibit the deficiencies of the conventional laser 40 shown in FIG. 1. As described earlier, FIG. 1 shows a second order diffraction grating 42 that has first-order diffraction orders that lead to continuous radiation loss while the fundamental mode ($0^{th}$ order) and the feedback ($2^{nd}$ order) beam propagate forward and backward. This loss occurs along the entire length of the grating 42. Identification that radiation loss occurs along the entire length of the grating allowed the inventors to attempt limiting that loss. Thus, one structure the invention provides to reduce the magnitude of this diffraction loss is a short-length DFB section (referred to as a "partial grating") inside the laser cavity 12 rather than using a grating that is distributed along the entire cavity of the DFB laser as shown in FIG. 1, and also in FIG. 4A. An example of such a partial or abbreviated grating 22 is shown in FIG. 4B.

Figure 4A:
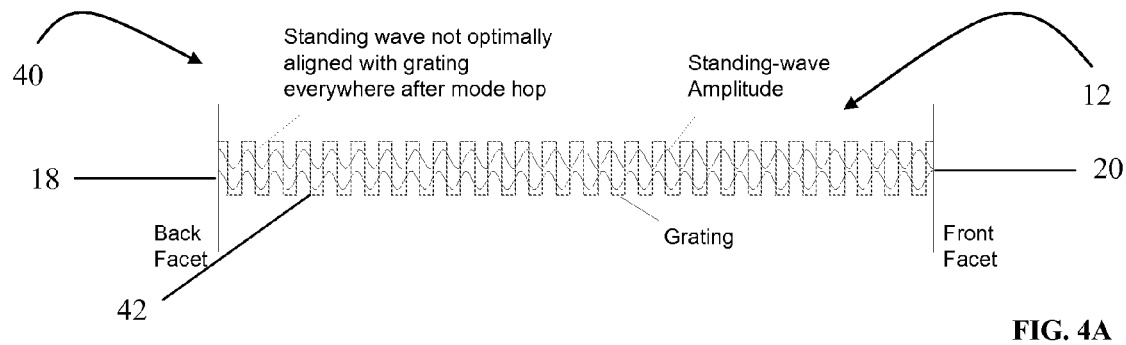
FIG. 4A is a schematic diagram showing the position of the wave applied to a conventional, full length grating.
Figure 4B:
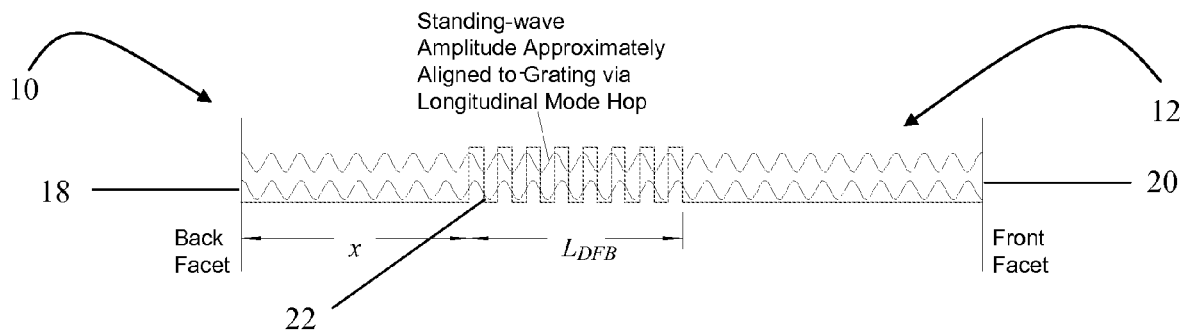
FIG. 4B is a schematic diagram showing the position of the wave applied to a partial grating according to the invention.

The random cleave position with respect to the grating 42 can make it, in general, impossible to align with the standing wave as shown in FIG. 4A. As described here, one possible way to alleviate this problem is to use a DFB grating 22 that is shorter than the length of the cavity 12 and separated from the front and back facets 20, 18 as shown in FIG. 4B. This configuration always has a FP mode that approximately aligns to the grating 22 within its length. FIG. 4B illustrates that, with the partial grating 22, the feedback will be much more consistent from laser to laser, thus improving yield in accuracy of output center wavelength.

The inventors' calculations show that the surface-diffracted output is approximately 2.1 percent of the front-facet 20 output power. Use of a partial grating further affords the opportunity to situate the grating 22 inside the laser cavity 12 and an area of optimum performance. Further, the total field intensity is smallest near the back facet 18 by around a factor of two. Since the field intensity is lower towards the back facet 18 compared to the front facet 20, lower diffraction loss occurs there. Therefore, placing a partial grating 22 near the back facet would produce lower loss than near the front facet 20. In fact, placement of a partial grating in the rear of the cavity may result in surface-emission loss of only 0.3% of the front-facet output power. In addition, not only is the overall field intensity weaker at the back facet 18, but the right- and left-going fields are closer in magnitude, which helps the optical-interference cancellation in the surface diffraction providing both lower loss and stronger mode discrimination as well.

The schematic drawing in FIG. 1 illustrates a stylized view of a conventional distributed feedback laser 40 with second-order grating 42 located a distance 'd' from the peak of the optical field. The fundamental mode shown in the optical intensity profile curve 24 propagates toward the front facet 20 (3% AR coating 16). A second-order diffraction provides feedback and propagates towards the back facet 18 (95% HR coating 14). The ±1 firsts-order diffraction losses occur normal to the fundamental mode propagation direction, i.e., as shown, the first order diffraction loss occurs normal to the propagation direction along the entire length of the grating.

Figure 2:
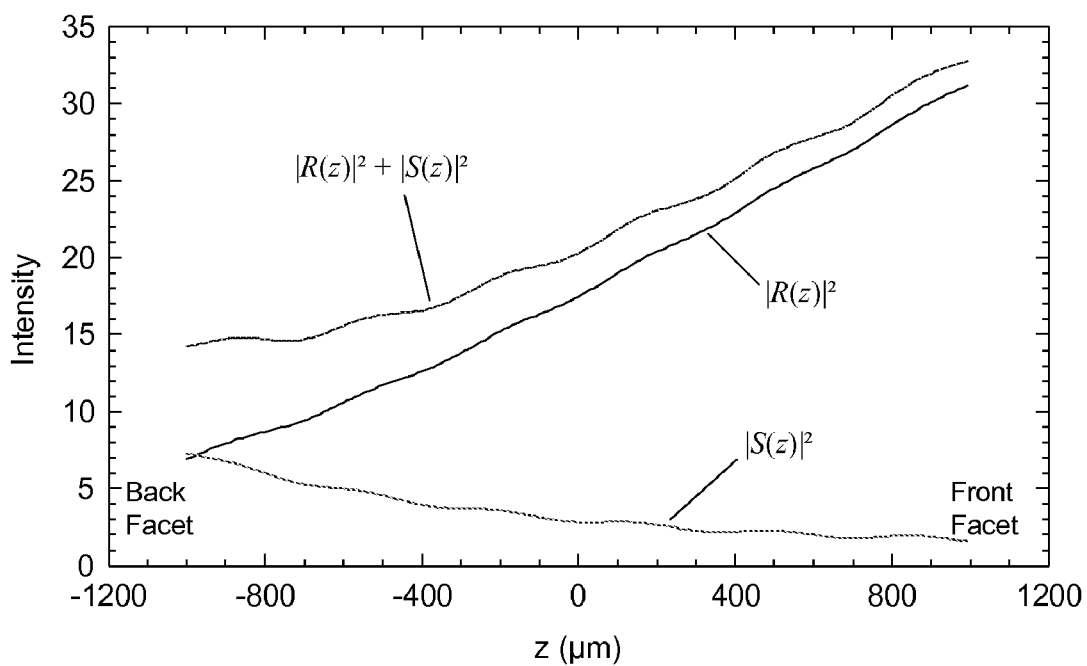
FIG. 2 is a graph showing the longitudinal field of a weak-grating DFB laser, under the following conditions: 2 mm×5 μm wide stripe, J=3000 A/cm², Re(κ)=2.0 cm⁻¹, Im(κ)=0.1 cm⁻¹, $\alpha_{surf}$=0.2 cm⁻¹, ζ=0. $R_f$=0.05, 0.4 waves $R_b$=0.95, −0.4 waves, antiguiding=1.5.

The inventors modeling used a self-consistent, above-threshold code (SE-DFB Simulator, copyright © 2007 Alfalight, Inc.) that was written for SE-DFB lasers but which also has facet-reflection effects. The DFB region extended across the entire stripe length. The results of the modeling are shown in FIG. 2, plotting the optical field against the distance from the center of the cavity, where, $|R(z)|^2$ represents the right field intensity and $|S(z)|^2$ represents the left field intensity and $|R(z)|^2+|S(z)|^2$ represents the sum of the two or total field intensity. This data shows that the total field intensity is smallest near the back facet 18 by around a factor of two. As indicated in FIG. 2, the surface-diffracted output was determined to be 2.1 percent of the front-facet output power.

Locating the partial grating a minimum distance away from either front facet 20 or back facet 18 as described by Equation (6) also ensures immunity against phase walk-off from emitter-to-emitter in the event of small but finite misalignment between the laser facets 18/20 and the grating 22. These data indicate that, as shown in FIG. 4B, placing a short-length (partial) DFB (p-DFB) grating 22 near the back facet 18 of the laser cavity 12 should produce a higher efficiency output than when a full length grating 42 is used. Not only is the overall optical field weaker near the back facet, but the right- and left-going fields are closer in magnitude, which helps the optical-interference cancellation in the surface diffraction and gives stronger mode discrimination.

Figure 3A:
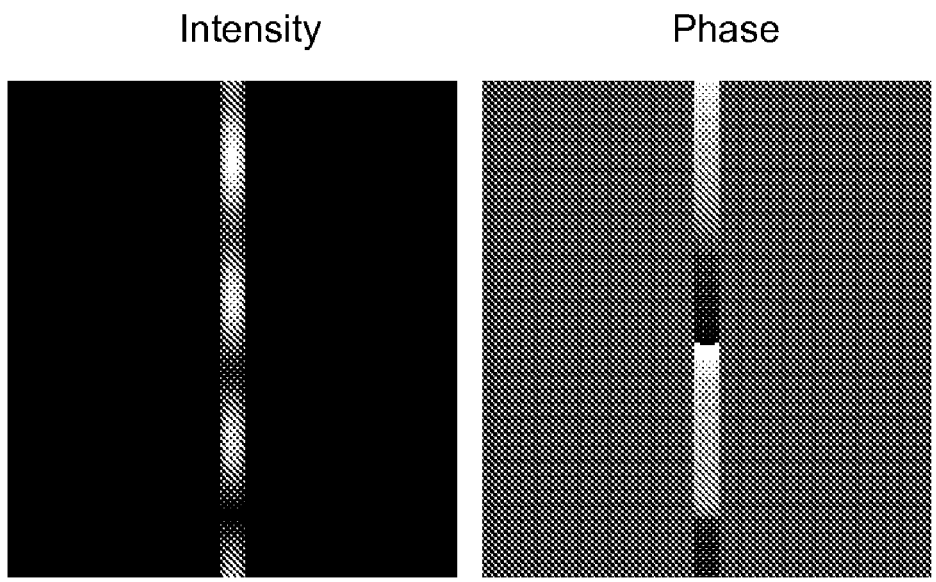
FIGS. 3A, 3B and 3C are figures showing the effect of varying facet-grating phase on the surface-diffracted near field for a 1-mm cavity-length device, with all cases having $R_f=0.05$ $R_b=0.95$, rhe front/back phases being (3A) 0.4/−0.4 waves (3B) −0.5/0.1 waves, (3C) 0/0 waves, and the front facet being on the top side of each image.
Figure 3B:
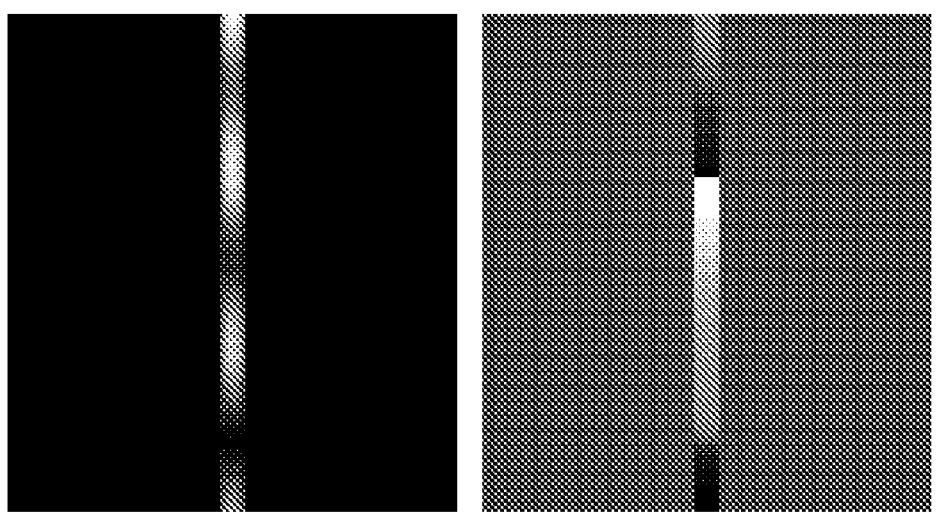
Figure 3C:
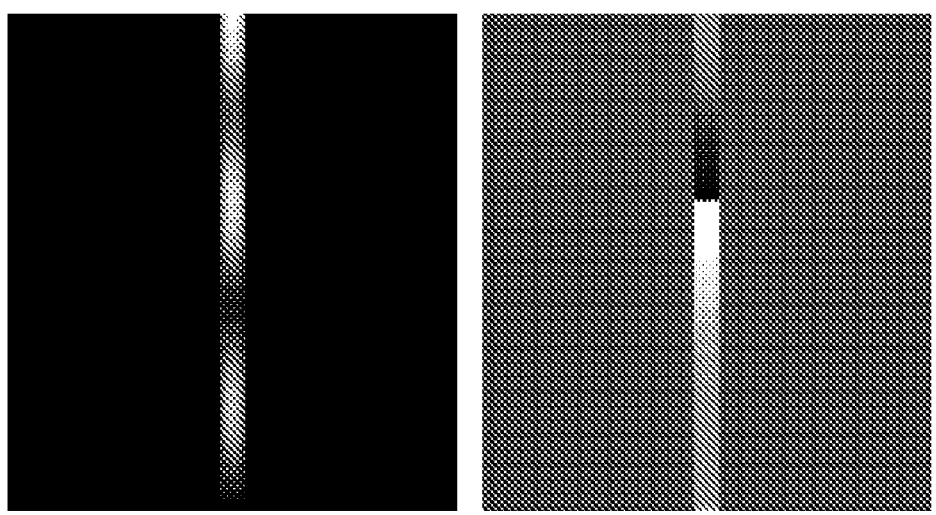

The alignment of a conventional, full length, grating 42 to the standing-wave strongly affects the feedback. The random phase between the cleave and grating 42 can thereby cause variability in the spectral behavior of the device. The numerical model does not include spectral prediction. However, with conventional gratings 42, the cleave-grating phase showed noticeable effects when comparing the surface-diffracted near field intensity as shown in FIGS. 3A-3C, which used the same conditions as in FIG. 2 except that the cavity length was 1 mm instead of 2 mm. This model can lock onto higher-order modes so that these images should be taken as representative. For example, in FIG. 3A the front/back phase is 0.4/−0.4 waves with the intensity being illustrated in the left-hand image and the phase being illustrated in the right-hand image. Similarly, FIG. 3B shows the effect on the surface-diffracted near field when the front and back phases are −0.5/0.1 waves. As in the previous example, the intensity is shown in the left hand image while the phase is shown in the right-hand image. FIG. 3C shows a third example of the effects of random cleaving on the surface-diffracted near field intensity when the front and back phases are 0/0 waves. These results illustrate that when a full length grating is used, the effects of random cleaving result in varied intensities and phases of the emitted radiation resulting in a variable spectral output and a wider bandwidth output.

EXAMPLE 1

Model of Partial-Length DFB

FIG. 4A shows a hypothetical example of an idealized full-length grating having a random cleave that allows the standing wave to be aligned with the peaks and valleys of the grating. This mode is strongly discriminated for by the laser because it has zero radiation loss as compared to the mode with the standing-wave peaks centered on the grating, which has maximum radiation loss. Because this hypothetical "random" cleave does not occur naturally, FIG. 4B illustrates a preferred embodiment of the invention comprising a partial grating that allows alignment of the standing wave due to its separation from the front and rear facets. This is true exactly when the right- and left-going wave intensities are the same but still has a significant effect when they are unequal.

The FP resonances have an integer number m of half-wave nodes between the facets:

$$m\lambda = 2nL \qquad (1)$$

where n is the index of refraction and L is the cavity length. There is a DFB region along the stripe of length $L_{DFB}$ and distance x from the back facet as shown in FIG. 4B. The number of half-wave nodes in this region, denoted p (not an exact integer) is found from:

$$p\lambda = 2nx. \quad (2)$$

Substituting (1) to eliminate the wavelength variable produces:

$$pL = xm. \quad (3)$$

The standing wave can be aligned with the grating at x via a number of mode hops Δm. The number required must be enough to shift the standing wave up to the maximum deviation caused by the random cleave. The standing wave nodes are ½ waves apart so that the maximum alignment deviation needed to cover all cases is ±¼ waves. This corresponds to Δp=±½ since p is in units of half waves. Therefore, Δm is in the range of:

$$|\Delta m| = \frac{L}{2x}. \quad (4)$$

The wavelength change associated with mode hops becomes larger as x becomes smaller. At some point it shifts the lasing wavelength too far from the target value. The total wavelength change is given by:

$$\Delta\lambda = \Delta m \frac{\lambda^2}{2n_g L} = \frac{\lambda^2}{8 n_g x} \quad (5)$$

where $n_g \approx 4.1$ is the group index. The minimum size constraint on x is thus:

$$x > \frac{\lambda^2}{8 n_g \Delta\lambda}. \quad (6)$$

For example, if the allowed wavelength shift is $\Delta\lambda_{max} \approx 0.25$ nm then $x \geq 100$ μm.

There is also a constraint on the maximum size of x. If x is too large then a single mode-hop Δm=±1 will have too coarse an adjustment. A reasonable requirement is that the grating and standing wave line up with no more than ±1/10 wave at the ends of the grating region, corresponding to Δp=±⅕. This implies that:

$$x < \frac{L}{5}. \quad (7)$$

The grating length $L_{DFB}$ also has maximum and minimum constraints. The spectral bandwidth of the feedback becomes larger as $L_{DFB}$ is made smaller. The spectral width of the grating feedback is bounded by (from DBR theory) as:

$$\Delta\lambda = \frac{\lambda^2}{2 n_g L_{DFB}} \quad (8)$$

which implies the constraint:

$$L_{DFB} > \frac{\lambda^2}{2n\Delta\lambda}. \quad (9)$$

For example, if the wavelength band must be less than Δλ<0.25 nm then $L_{DFB}$>400 μm.

The constraint on the maximum value of $L_{DFB}$ is the same concept as the maximum of x, i.e., increased misalignment at its far end. The constraint is analogous to (7):

$$L_{DFB} < \frac{L}{5}. \quad (10)$$

Summary of Design Rules

The above analysis of the design constraints can be summarized in two relations: and $$\frac{\lambda^2}{8 n_g \Delta\lambda} < x < \frac{L}{5} \quad (11)$$

$$\frac{\lambda^2}{2 n_g \Delta\lambda} < L_{DFB} < \frac{L}{5}. \quad (12)$$

If these conditions are satisfied then the laser device should not be very sensitive to the random facet-grating phase problem. It should be appreciated that the arguments used in this derivation could equally apply to the front facet. That is because only the optical phase was considered. As was shown in FIG. 2, for some applications, the best location should be toward the back facet.

EXAMPLE 2

Theoretical Design

Figure 5:
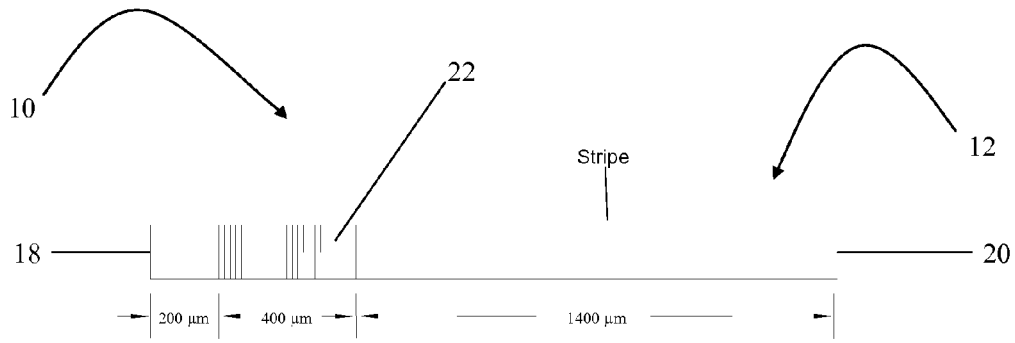
FIG. 5 is an example of a design for a laser device with a 2-mm total cavity length and partial DFB (p-DFB) section.

An example of one design according to an exemplary embodiment of the invention is shown in FIG. 5. If Δλ=±0.25 nm and L=2 mm then x should be between 100-400 μm and $L_{DFB}$=400 μm (min. and max. are the same in this case). The value x=200 was chosen. This design is shown drawn to scale in FIG. 5.

Figure 6:
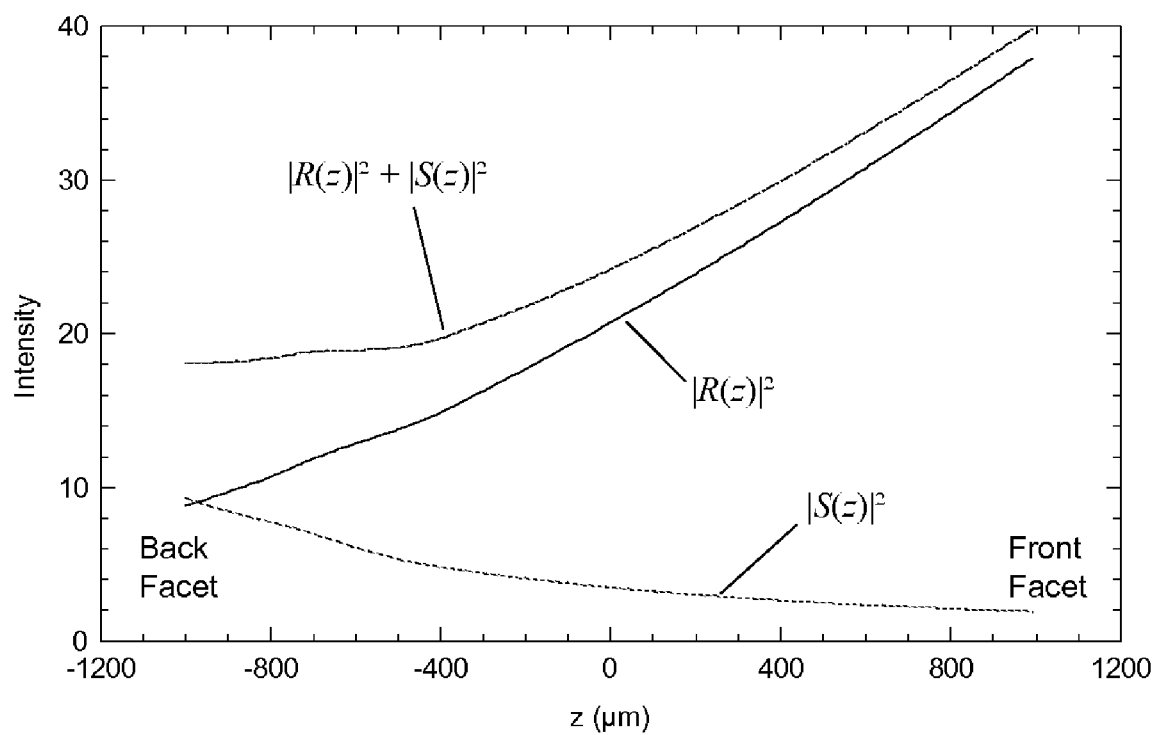
FIG. 6 is a plot showing the longitudinal fields from the laser shown in FIG. 5, where the conditions were otherwise the same as those in FIG. 2.
Figure 7:
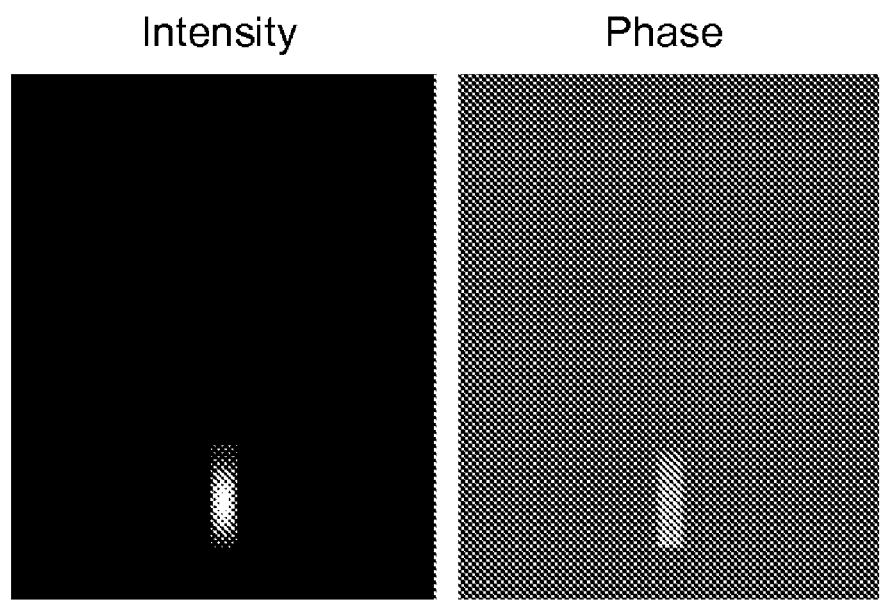
FIG. 7 shows two images of a typical surface-emission near field from the same design illustrated in FIG. 5 (narrow stripe).

The design shown in FIG. 5 was tested using the mathematical model, above. The longitudinal field is shown in FIG. 6. The conditions were otherwise the same as those in FIG. 2 and have similar overall field profiles. Most significantly, the surface-emission power (e.g. $1^{st}$ order power loss) dropped from 2.1 to 0.3 percent of the front-facet power—a factor of seven. Several different facet-cleave phases were tried and the results were similar in each case. FIG. 7 shows a typical near field surface emission from such an embodiment where the left panel shows the phase intensity image and the right panel shows the phase image. As illustrated, both the intensity and phase show a single discrete emission rather than the multiple, random emissions shown in FIGS. 3A-C.

EXAMPLE 3

Fabrication of the Laser

The DFB lasers were made with a two-step epitaxial growth process. The first growth comprised epitaxy of 0.6-μm thick N-cladding and 1.1-μm thick broad-waveguide core with 3.21 and 3.39 index of refraction, respectively, terminated with 0.2-μm thick InGaP layer of 3.21 index of refraction, which subsequently serves as the bottom portion of the grating layer. Second-order gratings 100-nm deep were fabricated in this layer using holographically exposed photoresist patterning and subsequent transfer of these grating patterns onto the underlying cladding layer was accomplished using reactive ion etching (RIE) technique. The second order grating has a pitch of $\Lambda=\lambda/n_{eff}=0.290$ μm, where $\lambda=0.975$ μm is the vacuum wavelength and $n_{eff}=3.36$ is the effective index of the fundamental mode in the waveguide. The remaining 0.6-μm thick P-cladding layer comprised a 0.3-μm thick (n=3.32) layer and a 0.3-μm thick (n=3.23) layer. Finally a 0.15-μm thick p$^+$-cap GaAs layer was then grown to complete the laser structure. This structure provides narrow transverse and lateral beam-widths, $\theta_\perp$, $\theta_{//}$, of approximately 38 degrees and 7 degrees FWHM respectively. The active region consists of an 85 Å InGaAs quantum well. The primary and the secondary crystal growth were performed by low-pressure metal organic vapor phase epitaxy (LP-MOVPE) in a multi-wafer reactor. Laser diodes were fabricated with 100-μm wide apertures and they were coated with conventional dielectric films to achieve approximately 4% front facet reflectivity and 95% back facet reflectivity. The diodes were mounted p-side down on a copper-tungsten heatsink using gold-tin solder. CW L-I-V measurements were performed at 25° C. heatsink temperature.

EXAMPLE 4

Figure 8:
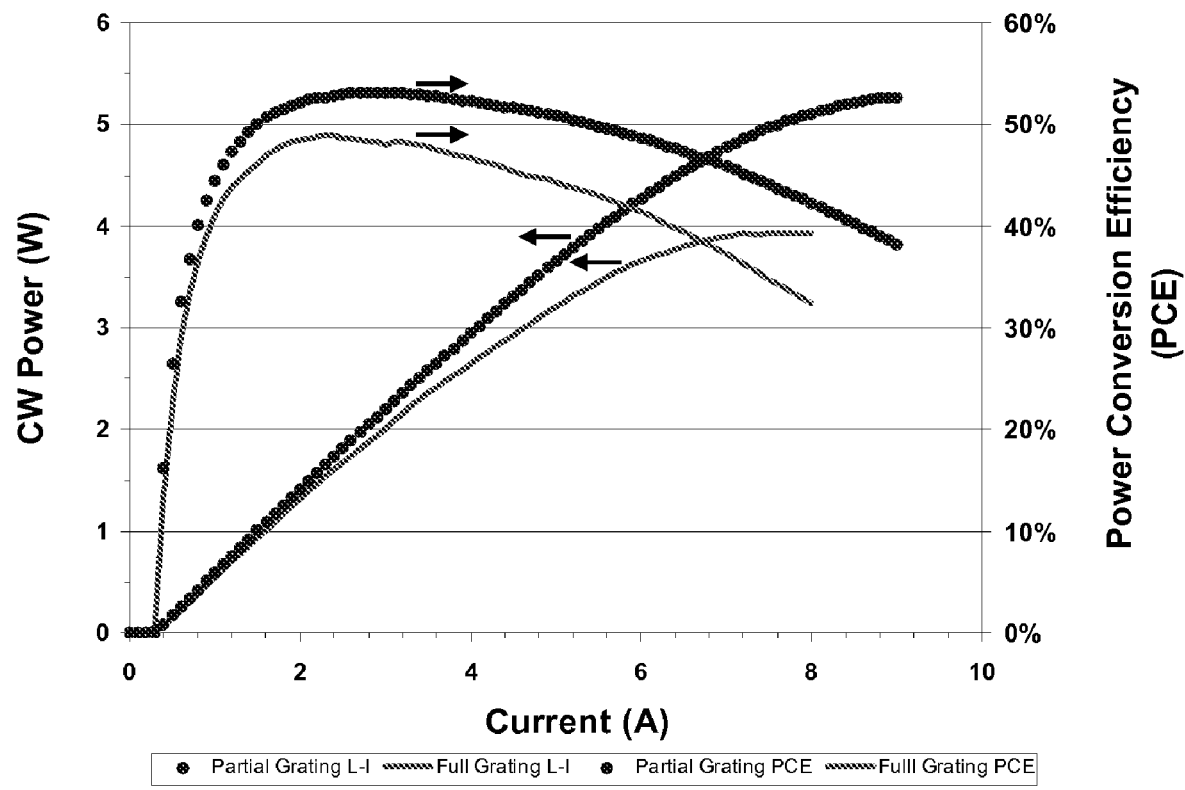
FIG. 8 is a graph of the laser output power (W) and power conversion efficiency (PCE) tested for full grating DFB laser (solid line) and partial grating DFB (p-DFB) (dotted line), wherein the right-facing arrows indicate the PCE trace while the left-facing arrows indicate the W trace.

Optical Power and Electrical-to-Optical Power Conversion Efficiency Data from Prototype The laser output power and power conversion efficiency were tested for the full grating (solid lines) and partial grating (dotted lines) DFB lasers as illustrated in the plots shown in FIG. 8. This plot clearly shows more than 1.4 watt of higher output power at 8 amperes of operation (e.g. greater than 20% peak power) and over 5% higher peak power conversion efficiency for the partial grating DFB laser (p-DFB) compared to the full grating DFB laser.

Further, it should be appreciated that in cases where a composite laser is used, e.g., multiple diode lasers integrated onto a semiconductors substrate, such as, for example, in optical read units as disclosed in U.S. Pat. Nos. 4,365,323; 4,363,116 and 5,854,780 (hereby incorporated by reference in their entirety for all purposes) the instant invention can also be used. In such cases, an abbreviated grating can be used in one of the diode lasers, several of the diode lasers or all of the diode lasers. In each case the use of the abbreviated grating disclosed herein provides increased efficiency for the composite laser.

Thus, as described above, the inventors have shown that by abbreviating the grating, housed in the laser cavity and separating the grating from both the front-end and the back-end of the laser facets, increased electrical-to-optical power conversion efficiency, wavelength stabilization and narrowed linewidth emission is achieved. In addition, not only is the overall optical intensity weaker, but the right- and left-going fields are closer in magnitude, which helps the optical-interference cancellation in the surface diffraction providing both lower loss and stronger mode discrimination. Thus, the first-order diffraction loss was significantly reduced, leading to a higher output power and therefore a higher electrical-to-optical power conversion efficiency in the laser was achieved. In addition, the inventors have shown that abbreviating the grating allows for greater ability of the light waves to be in sympathy with the peaks and valleys of the grating; therefore, the DFB laser should not be very sensitive to the random facet-grating phase problem whish leads to variable spectral output.

While this invention has been described in conjunction with the various exemplary embodiments outlined above, various alternatives, modifications, variations, improvements and/or substantial equivalents, whether known or that are or ma be presently unforeseen, may become apparent to those having at least ordinary skill in the art. Accordingly, the exemplary embodiments according to this invention as set forth above, are intended to be illustrative, not limiting. Various changes may be made without departing from the spirit and scope of the invention. Therefore, the invention is intended to embrace all known or later developed alternatives, modifications, variations improvements, and/or substantial equivalents of these exemplary embodiments.

What is claimed is:

1. An edge emitting semiconductor laser comprising:
   a front facet,
   a rear facet, which defines, together with the front facet, a laser cavity;
   a partial grating having at least one edge, the edge of the partial grating located in the laser cavity at a distance x from the rear facet approximately defined by range:

$$\frac{\lambda^2}{8n_g\Delta\lambda} < x < \frac{L}{5}$$

where $\Delta\lambda$ is a maximum allowed wavelength variation caused by interfering facet reflections, $n_g\approx 4$ the group index, $\lambda$ is the vacuum wavelength and L is the length of the grating.

2. The laser of claim 1, wherein the length of the partial grating is defined by:

$$\frac{\lambda^2}{2n_g\Delta\lambda} < L_{DFB} < \frac{L}{5}.$$

3. The laser of claim 1, wherein the partial grating has a length of less than about 90%-of the length of the laser cavity.

4. The laser of claim 3, wherein the partial grating has a length less than about 50% of the length of the laser cavity.

* * * * *